(12) United States Patent
Yabe et al.

(10) Patent No.: US 8,163,400 B2
(45) Date of Patent: *Apr. 24, 2012

(54) PLATED ARTICLE HAVING METAL THIN FILM FORMED BY ELECTROLESS PLATING, AND MANUFACTURING METHOD THEREOF

(75) Inventors: Atsushi Yabe, Kitaibaraki (JP); Junichi Ito, Kitaibaraki (JP); Yoshiyuki Hisumi, Kitaibaraki (JP); Junnosuke Sekiguchi, Kitaibaraki (JP); Toru Imori, Kitaibaraki (JP)

(73) Assignee: Nippon Mining & Metals Co., Ltd., Minato-ku, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 12/311,207

(22) PCT Filed: Jul. 18, 2008

(86) PCT No.: PCT/JP2008/063024
§ 371 (c)(1),
(2), (4) Date: Mar. 20, 2009

(87) PCT Pub. No.: WO2009/016980
PCT Pub. Date: Feb. 5, 2009

(65) Prior Publication Data
US 2010/0038111 A1 Feb. 18, 2010

(30) Foreign Application Priority Data
Jul. 31, 2007 (JP) ................................ 2007-200163

(51) Int. Cl.
*H01L 29/00* (2006.01)
*H05K 3/00* (2006.01)

(52) U.S. Cl. ........ 428/615; 428/209; 428/617; 428/618; 428/697; 257/506; 427/98.1; 427/99.5

(58) Field of Classification Search .................. 428/209, 428/615, 617–618, 697; 257/508; 427/98.1, 427/99.5
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 6,696,758 B2 * | 2/2004 | Dubin et al. | 257/750 |
| 7,622,382 B2 * | 11/2009 | Chowdhury et al. | 438/637 |

FOREIGN PATENT DOCUMENTS

| | | |
|---|---|---|
| JP | 2000260958 | 9/2000 |
| JP | 2002-141305 | 5/2002 |
| JP | 2003-288833 | 10/2003 |
| JP | 2005-033029 | 2/2005 |
| JP | 2005113174 | 4/2005 |
| JP | 2008-223100 | 9/2008 |
| WO | WO 2005/038086 | 4/2005 |

OTHER PUBLICATIONS

Office Action of Japan Patent Office dated Jun. 18, 2009 (3 pages).

* cited by examiner

*Primary Examiner* — Cathy Lam
(74) *Attorney, Agent, or Firm* — Flynn, Thiel, Boutell & Tanis, P.C.

(57) ABSTRACT

The present invention provides a plated article that has a thin seed layer having a uniform thickness, formed by electroless plating and allowing formation of ultrafine wiring, and that avoids the complicated formation of a bilayer of a barrier layer and a catalytic metal layer prior to forming the seed layer. The present invention also provides a method for manufacturing the plated article. The plated article has an alloy thin film formed on a substrate and containing a catalytically active metal (A) for electroless plating and a metal (B) capable of undergoing displacement plating with a metal ion contained in an electroless plating solution, and a metal thin film formed on the alloy thin film by electroless displacement and reduction plating. The alloy thin film of the catalytically active metal (A) and the metal (B) capable of displacement plating has a composition comprising 5at% to 40at% of the metal (A). The metal thin film formed by electroless displacement and reduction plating is a metal thin film having a thickness no greater than 10 nm and a resistivity no greater than 10 μΩ·cm. Preferably, the metal (B) has a barrier function with respect to a metal of the metal thin film.

22 Claims, No Drawings

PLATED ARTICLE HAVING METAL THIN FILM FORMED BY ELECTROLESS PLATING, AND MANUFACTURING METHOD THEREOF

BACKGROUND OF THE INVENTION

1. Field of the Invention

The present invention relates to a plated article having a metal thin film formed by electroless plating, and to a method for manufacturing the plated article.

In particular, the present invention relates to a plated article in which a metal thin film is formed by electroless copper plating as a seed layer in forming ULSI ultrafine copper wiring (damascene copper wiring), and to a method for manufacturing the plated article.

2. Description of the Related Art

Electroless copper plating holds the promise of superseding current methods, such as sputtering and copper electroplating, as a method for forming copper films in ULSI ultrafine copper wiring (damascene copper wiring).

It has been difficult to achieve sufficient adherence in a deposited plating film when electroless copper plating is carried out on mirror surfaces such as that of a semiconductor wafer. It has also been difficult to carry out uniform plating over the entire surface of a substrate, on account of low plating reactivity. Other problems have been the difficulty of achieving uniform plating, and the lack of sufficient adherence, when forming a copper seed layer by electroless plating on a barrier metal layer such as tantalum nitride.

The inventors had already found that the plating deposition rate can be slowed down and crystals become extremely fine, allowing a thin film having a uniform thickness of no greater than 15 nm to be formed on a mirror surface such as a wafer. This can be achieved by preparing an electroless copper plating solution with an additive of a water-soluble nitrogen-containing polymer having a small weight-average molecular weight (Mw), preparing a substrate to be plated by causing a catalyst metal to adhere thereto or by forming a catalyst metal film on the outermost surface of the substrate, and immersing the substrate in the plating solution to cause adhesion of the polymer onto the catalyst metal via nitrogen atoms (Japanese Patent Application No. 2007-064348). Furthermore, in a working example of the above invention, the inventors showed that the plating deposition rate can be slowed down, and the crystals become extremely fine, allowing a thin film having a uniform thickness of no greater than 6 nm to be formed on a mirror surface such as that of a wafer, by forming beforehand a catalyst metal film on the outermost surface, followed by immersing the substrate in a plating solution to cause adhesion of a polymer onto the catalyst metal via nitrogen atoms.

In damascene copper wiring of the above method, when providing a copper seed layer by electroless plating after formation of a catalytic metal layer, a barrier layer aside from the catalytic metal layer should be formed beforehand for the prevention of copper diffusion. This means that a bilayer of the barrier layer and the catalytic metal layer needs to be formed prior to the copper seed layer formation. This has turned out to be problematic in terms of applicability to actual processing of ultrafine wiring, where the film thickness cannot be great.

SUMMARY OF THE INVENTION

It is thus an object of the present invention to provide a preliminary treatment technique that avoids the complicated formation of these two layers prior to forming the copper seed layer, and that allows forming a thin seed layer of uniform thickness on which ultrafine wiring can be formed. A further object of the present invention is to provide a plated article comprising a thin seed layer, of uniform thickness, formed by electroless plating using the above preliminary treatment technique, and to provide a method for manufacturing the plated article.

As a result of diligent research, the inventors perfected the present invention upon finding that the thickness of a copper seed layer formed on a single layer having both a barrier function and catalytic ability can be made thin and uniform by using concomitantly electroless displacement and reduction plating, wherein the single layer having both a barrier function and catalytic ability is obtained by alloying a catalytically active metal for electroless plating with a metal having a barrier function and capable of undergoing displacement with a metal ion in an electroless plating solution.

Specifically, the present invention is as follows.

[1] A plated article which has an alloy thin film formed on a substrate and containing a catalytically active metal (A) for electroless plating and a metal (B) capable of undergoing displacement plating with a metal ion contained in an electroless plating solution, and a metal thin film formed on the alloy thin film by electroless displacement and reduction plating, wherein the alloy thin film containing the catalytically active metal (A) and the metal (B) capable of displacement plating has a composition comprising 5at% to 40at% of the catalytically active metal (A), and the metal thin film formed by electroless displacement and reduction plating is a metal thin film having a thickness no greater than 10 nm and a resistivity no greater than 10 $\mu\Omega\cdot cm$.

[2] The plated article according to [1], wherein the metal thin film formed by electroless displacement and reduction plating has a thickness no greater than 10 nm and a resistivity no greater than 5 $\mu\Omega\cdot cm$.

[3] The plated article according to [1] or [2], wherein a wiring portion is further formed on the metal thin film by plating.

[4] The plated article according to any one of [1] to [3], wherein oxygen concentration at the interface between the alloy thin film and the metal thin film formed by electroless displacement and reduction plating is no greater than 1 at% as analyzed by Auger electron spectroscopy.

[5] The plated article according to [3] or [4],
wherein the catalytically active metal (A) is at least one metal selected from among rhodium, ruthenium and iridium,
the metal (B) capable of displacement plating is at least one metal selected from among iron, nickel, cobalt, tungsten, niobium, tin, magnesium, aluminum, zinc and lead,
the metal thin film formed on the alloy thin film by electroless displacement and reduction plating is a thin film comprising at least one metal selected from among gold, silver, copper, nickel, cobalt, iron and tin, and
the wiring portion is copper or an alloy having copper as a main component.

[6] The plated article according to [5], wherein the metal (B) capable of displacement plating has a barrier function of preventing diffusion of a metal of the metal thin film formed by electroless displacement and reduction plating.

[7] The plated article according to [5] or [6],
wherein the catalytically active metal (A) is at least one metal selected from among rhodium and ruthenium,
the metal (B) capable of displacement plating is at least one metal selected from among tungsten and niobium, the metal thin film formed on the alloy thin film by electroless displacement and reduction plating is a thin film of copper or of an alloy having copper as a main component, and the wiring portion is copper or an alloy having copper as a main component.

[8] The plated article according to any one of [5] to [7], wherein the catalytically active metal (A) is ruthenium, the metal (B) capable of displacement plating is tungsten, the metal thin film formed on the alloy thin film by electroless displacement and reduction plating is a copper thin film, and the wiring portion is copper.

[9] The plated article according to any one of [1] to [8], wherein the metal thin film formed by electroless displacement and reduction plating is a seed layer for damascene copper wiring.

[10] The plated article according to any one of [1] to [9], wherein the alloy thin film is formed by sputtering.

[11] A semiconductor element, comprising the plated article according to any one of [1] to [10].

[12] A sputtering target used for forming the alloy thin film of the plated article according to [10].

[13] A method for manufacturing a plated article by forming, on a substrate, an alloy thin film containing a catalytically active metal (A) for electroless plating and a metal (B) capable of undergoing displacement plating with a metal ion contained in an electroless plating solution, and forming a metal thin film on the alloy thin film by electroless displacement and reduction plating, wherein the alloy thin film containing the catalytically active metal (A) and the metal (B) capable of displacement plating has a composition comprising 5at% to 40at% of the catalytically active metal (A), and the metal thin film formed by electroless displacement and reduction plating is a metal thin film having a thickness no greater than 10 nm and a resistivity no greater than 10 $\mu\Omega\cdot$cm.

[14] The method for manufacturing a plated article according to [13], wherein the metal thin film formed by electroless displacement and reduction plating has a thickness no greater than 10 nm and a resistivity no greater than 5 $\mu\Omega\cdot$cm.

[15] The method for manufacturing a plated article according to [13] or [14], wherein a wiring portion is further formed on the metal thin film by plating.

[16] The method for manufacturing a plated article according to any one of [13] to [15], wherein oxygen concentration at the interface between the alloy thin film and the metal thin film formed by electroless displacement and reduction plating is no greater than 1 at % as analyzed by Auger electron spectroscopy.

[17] The method for manufacturing a plated article according to [15] or [16], wherein the catalytically active metal (A) is at least one metal selected from among rhodium, ruthenium and iridium, the metal (B) capable of displacement plating is at least one metal selected from among iron, nickel, cobalt, tungsten, niobium, tin, magnesium, aluminum, zinc and lead, the metal thin film formed on the alloy thin film by electroless displacement and reduction plating is a thin film comprising at least one metal selected from among gold, silver, copper, nickel, cobalt, iron and tin, and the wiring portion is copper or an alloy having copper as a main component.

[18] The method for manufacturing a plated article according to [17], wherein the metal (B) capable of displacement plating has a barrier function of preventing diffusion of a metal of the metal thin film formed by electroless displacement and reduction plating.

[19] The method for manufacturing a plated article according to [17] or [18], wherein the catalytically active metal (A) is at least one metal selected from among rhodium and ruthenium, the metal (B) capable of displacement plating is at least one metal selected from among tungsten and niobium, the metal thin film formed on the alloy thin film by electroless displacement and reduction plating is a thin film of copper or of an alloy having copper as a main component, and the wiring portion is copper or an alloy having copper as a main component.

[20] The method for manufacturing a plated article according to any one of [17] to [19], wherein the catalytically active metal (A) is ruthenium, the metal (B) capable of displacement plating is tungsten, the metal thin film formed on the alloy thin film by electroless displacement and reduction plating is a copper thin film, and the wiring portion is copper.

[21] The method for manufacturing a plated article according to any one of [13] to [20], wherein the metal thin film formed by electroless displacement and reduction plating is a seed layer for damascene copper wiring.

[22] The method for manufacturing a plated article according to any one of [13] to [21], wherein the alloy thin film is formed by sputtering.

When forming a seed layer by electroless plating on a barrier metal layer on a substrate, it is important in the present invention to preliminarily form an alloy thin film comprising a specific composition of a catalytically active metal for electroless plating and a metal capable of undergoing displacement plating with a metal ion contained in an electroless plating solution. This prevents erosion of the above-described preliminary thin film surface, which is the underlying surface during the formation thereon of a metal thin film such as copper or the like by electroless displacement and reduction plating, and allows forming, on the alloy thin film, a uniform and sufficiently thin metal thin-film layer of copper or the like having excellent adherence. This also makes it possible that the interface between the preliminarily formed alloy thin film and the electroless plating layer formed thereon contains substantially no oxygen.

The alloy thin film can be made into a single layer having both a barrier function and catalytic ability when the metal capable of undergoing displacement plating with a metal ion contained in the electroless plating solution is a metal having a barrier function preventing diffusion of a metal of the metal thin film formed by electroless plating. The inconvenience of forming two layers, i.e. a barrier layer and a catalytic metal layer, can thus be avoided, while affording a yet thinner film.

DETAILED DESCRIPTION OF THE PREFERRED EMBODIMENTS

The present invention relates to a method for forming a metal thin film by electroless plating. The method involves forming an alloy thin film of a catalytically active metal (A) for electroless plating and a metal (B) capable of undergoing displacement plating with a metal ion contained in an electroless plating solution on a substrate prior to forming the metal thin film. The method also involves using concomitantly a reduction reaction in the electroless plating solution, and a displacement reaction with a metal ion contained in the electroless plating solution, to form thereby a metal thin film (seed layer). The invention relates also to a plated article having formed thereon the seed layer thus obtained.

In the present invention, electroless plating uses concomitantly reduction plating and displacement plating.

Through displacement plating, any oxide on the surface of the alloy thin film is removed during the displacement plating process. Reduction plating takes place also simultaneously therewith. These contribute to forming a thin and uniform film that is required for forming a seed layer having a desired conductivity.

As a result, the thickness of the seed layer can be kept to no greater than 10 nm and the resistivity to no greater than 10 $\mu\Omega\cdot cm$. Reducing the thickness of the seed layer allows using the seed layer in damascene copper wiring having a line width of several tens of nm.

As a result of the above effect, the oxygen concentration at the interface between the alloy thin film and the metal thin film formed by electroless displacement and reduction plating of copper or the like, as analyzed by Auger electron spectroscopy (AES), turns out to be no greater than 1 at % (no greater than the detection limit). By contrast, oxygen is appreciably detected at the interface when using tantalum, on which displacement plating has no effect, as the metal having a barrier function.

The presence of oxygen at the interface is detrimental, for instance, on account of the associated increase of wiring resistance and loss of barrier function.

Examples of the catalytically active metal (A) for electroless plating include, for instance, rhodium, ruthenium and iridium. The metal used is at least one metal selected from among the foregoing, and rhodium or ruthenium is preferable, in particular ruthenium. An alloy comprising two or more metals having catalytic activity may also be used. In the present invention, the feature of being catalytically active for electroless plating refers to having catalytic ability in a reaction of forming a plating film through the reduction of metal ions of copper or the like in an electroless plating solution.

Examples of the metal (B) capable of undergoing displacement plating with a metal ion contained in an electroless plating solution include, for instance, iron, nickel, cobalt, tungsten, niobium, tin, magnesium, aluminum, zinc and lead. The above alloy thin film can be made into a single layer having both a barrier function and catalytic ability when the metal (B) has a barrier function against a metal of the metal thin film formed by electroless displacement and reduction plating. This is preferable in that, thereby, the inconvenience of forming two layers, i.e. a barrier layer and a catalytic metal layer, can be avoided, while affording a yet thinner film in damascene copper wiring formation. Examples of a metal (B) having such a barrier function include, for instance, tungsten and niobium. The metal used is at least one metal selected from among the foregoing, although tungsten is particularly preferred.

Preferably, the composition of the alloy thin film of the metal (B) capable of undergoing displacement plating with a metal ion contained in an electroless plating solution and the catalytically active metal (A) for electroless plating comprises ordinarily a composition ratio of metal (A) ranging from 5 at % to 40 at %. When the composition ratio of metal (A) is less than 5 at %, the displacement reaction dominates in the plating solution over the reduction reaction, and the member to be plated is eroded, which precludes forming a uniform thin film. In addition to this, when the metal (B) is a metal having the above barrier function, the resulting uneven film exhibits extremely thin portions that impair the barrier function. By contrast, when the metal (B) is a metal having the above barrier function, a composition ratio of the metal (A) beyond 40 at % means that the composition ratio of the metal (B) is too low, which impairs the barrier function. Such a composition ratio leads to a high film production cost as well, which is also problematic.

Preferably, the alloy thin film is formed on the substrate by sputtering using a sputtering alloy target comprising the metal (A) and the metal (B). An alloy thin film having the above composition can be formed using a sputtering target comprising the metal (A) and the metal (B) in a composition substantially identical to the composition of the desired alloy thin film.

The thickness of the alloy thin film ranges preferably from 3 to 20 nm, more preferably from 5 to 15 nm.

In the present invention, the substrate on which the alloy thin film is formed is preferably a semiconductor wafer. The substrate may be cleaned and be imparted an enhanced wettability by being subjected to an acid treatment, an alkali treatment, a surfactant treatment, ultrasonic cleaning, or a combination of the foregoing.

The metal thin film formed by electroless displacement and reduction plating is formed in the form of a metal by deposition of metal ions contained in an electroless plating solution, through a displacement reaction of the metal (B) and a metal ion contained in the electroless plating solution and through the catalytic effect of the metal (A) in the reduction of a metal ion of the electroless plating solution. The metal thin film may comprise at least one metal selected from among gold, silver, copper, nickel, cobalt, iron and tin. The metal thin film is preferably a thin film of copper or of an alloy having copper as a main component, and more preferably, in particular, a copper thin film.

Ordinary methods may be used as the electroless plating method employed during electroless displacement and reduction plating using the barrier-plus-catalytic layer (alloy thin film) of the present invention. Likewise, ordinary plating solutions may be used for the plating.

Ordinary methods can be used as the electroless copper plating method employed during electroless displacement and reduction plating using the barrier-plus-catalytic layer (alloy thin film) of the present invention. Likewise, ordinary electroless copper plating solutions may be used as the copper plating solution employed.

An electroless copper plating solution comprises ordinarily, for instance, copper ions, a copper ion complexing agent, a reducing agent and a pH adjuster.

In view of the negative effect of formalin on humans and the environment, glyoxylic acid is preferably used as the reducing agent of the electroless copper plating solution. Although phosphinic acid does not exhibit a reducing activity on copper, it does exhibit a high reducing activity on a catalyst metal such as palladium or the like, and hence phosphinic acid is effective for increasing the reactivity of an initial plating involving a catalyst metal. Also, these acids do not comprise sodium, which is an impurity best avoided in semiconductor applications.

Therefore, glyoxylic acid and phosphinic acid are used simultaneously as more preferred reducing agents. Such a concomitant use affords a higher plating reactivity than when using glyoxylic acid alone. An electroless copper plating solution is thus obtained thereby that allows uniform plating at a lower temperature on a mirror surface such as that of a wafer or the like, where plating reactions occur with difficulty. A higher plating reactivity allows plating to take place at a lower temperature. The lower temperature increases in turn solution stability, and facilitates achieving finer and more uniform deposited copper particles.

The concentration of glyoxylic acid in the plating solution ranges preferably from 0.005 to 0.5 mol/L, more preferably from 0.01 to 0.2 mol/L. At a concentration below 0.005 mol/

L, the plating reaction does not take place, while beyond 0.5 mol/L the plating solution becomes unstable and decomposes.

The concentration of phosphinic acid in the plating solution ranges preferably from 0.001 to 0.5 mol/L, more preferably from 0.005 to 0.2 mol/L. At a concentration below 0.001 mol/L, the above effect is not seen, while beyond 0.5 mol/L the plating solution becomes unstable and decomposes.

Ordinarily employed copper ion sources can be used as the copper ion source in the electroless copper plating solution of the present invention. These include, for instance, copper sulfate, copper chloride, copper nitrate or the like. Also, any ordinarily employed complexing agent can be used as a copper ion complexing agent. Examples thereof include, for instance, ethylenediamine tetraacetate, tartaric acid or the like.

Other additives that can be used include additives ordinarily employed in plating solutions, such as 2,2'-bipyridyl, polyethylene glycol, potassium ferrocyanide or the like.

The electroless copper plating solution of the present invention is preferably used at a pH of 10 to 14, more preferably at a pH of 12 to 13. Herein there can be used any ordinarily employed pH adjuster, such as sodium hydroxide, potassium hydroxide or the like. However, tetramethylammonium hydroxide may be used when alkaline metals such as sodium or potassium are to be avoided in semiconductor applications.

From the standpoint of bath stability and copper deposition rate, the electroless copper plating solution of the present invention is preferably used at a bath temperature of 40 to 90° C.

In the present invention, the material to be plated is dipped in a plating bath, during plating using the electroless copper plating solution. The material to be plated is the alloy thin film formed as described above.

The metal thin film of the present invention, manufactured through electroless displacement and reduction plating, has preferably a thickness ranging from 3 to 10 nm.

The metal thin film of the present invention manufactured through electroless displacement and reduction plating is a thin plating film of uniform thickness. Therefore, using the metal thin film as a seed layer for damascene copper wiring allows forming a thin seed layer of uniform thickness even in small vias and/or trenches having a line width of 100 nm or less, allowing, as a result, production of a semiconductor wafer free of defects such as voids, seams or the like.

In the plated article of the present invention, a wiring portion can be further provided through plating onto the metal thin film formed by electroless plating. Electroplating or electroless plating may be used for forming the wiring portion. The wiring portion is preferably copper or an alloy having copper as a main component, more preferably copper. The copper electroplating solution is not particularly limited and may be of a composition ordinarily employed for damascene copper wiring filling. Herein there can be used a solution comprising copper sulfate and sulfuric acid, as main components, and chlorine, polyethylene glycol, bis(3-sulfopropyl) disodium disulfide, Janus green or the like, as minor components. As the electroless copper plating solution used for filling there can be used the plating solution for copper wiring filling described in Japanese Patent Publication No. 2005-038086.

The plated article of the present invention comprises the above-described specific alloy thin film formed on a substrate; and comprises the metal thin film, which acts as a seed layer, formed on the alloy thin film by electroless displacement and reduction plating. As described above, the aforementioned specific alloy thin film can be made into a single layer having both catalytic ability and a barrier function, and hence there is no need to form a barrier layer having ordinarily a thickness of several tens of nm. In the plated article of the present invention, the alloy thin film can be made thus into a single layer having both a barrier function and catalytic ability. Also, the thickness of the metal thin film acting as such a seed layer is no greater than 10 nm. Therefore, the plated article can be a semiconductor element that is applicable to damascene copper wiring having a line width of several tens of nm, by forming wiring portions on the metal thin film by ordinary metal plating methods. Moreover, the metal thin film acting as the seed layer has a resistivity no greater than 10 μΩ·cm, which facilitates uniform film formation during the early stage of subsequent electroplating. Preferably, the resistivity of the metal thin film is no greater than 5 μΩ·cm.

EXAMPLES

The invention is explained next based on examples. The invention, however, is in no way meant to be limited to or by these examples.

Example 1

A 10 nm-thick alloy thin film was manufactured on a semiconductor substrate, using a sputtering alloy target comprising ruthenium, as the catalytically active metal for electroless plating, and tungsten as the metal capable of undergoing displacement plating with a metal ion contained in an electroless plating solution. A copper plating thin film was then formed on the alloy film by electroless plating. The composition of the alloy thin film formed using the sputtering alloy target and the thickness of the copper thin film formed by electroless plating are listed in Table 1.

The copper film formation by electroless plating was conducted using a plating solution having the composition below, at pH 12.5, at 50° C., for 30 to 40 seconds.

| Plating solution composition | |
| --- | --- |
| Copper sulfate | 0.02 mol/L |
| Ethylenediamine tetraacetate | 0.21 mol/L |
| Glyoxylic acid | 0.03 mol/L |
| Phosphinic acid | 0.09 mol/L |
| 2,2'-bipyridyl | 20 mg/L | pH 12.5 (adjusted with potassium hydroxide)

The obtained copper plating thin film was evaluated as regards to thickness, resistivity, occurrence of copper diffusion into the alloy thin film, and occurrence of holes after stripping of the copper plating thin film. The oxidized state at the interface between the copper film and the alloy film during plating was checked on the basis of AES depth profile measurements.

The above-described sputtered alloy thin film and the electroless copper plating thin film were formed on a trench-patterned semiconductor substrate having a line width of 90 nm and aspect ratio 4. Thereafter, wiring was filled in by copper electroplating using the electroless copper plating thin film as a seed layer.

Wiring filling by electroplating was carried out using a plating solution having the composition below, at 25° C., over 60 seconds, and under a current density of 1 A/dm$^2$.

| | |
|---|---|
| Copper sulfate | 0.25 mol/L |
| Sulfuric acid | 1.8 mol/L |
| Hydrochloric acid | 10 mmol/L |

Small-amount additives (polyethylene glycol, bis(3-sulfopropyl)disodium disulfide, Janus green)

Filling ability on trench portions having a line width of 90 nm was evaluated on the basis of cleaved cross section SEM observation of the obtained copper plating film.

The results are given in Table 1.

Examples 2 to 7, Comparative Examples 1 to 3

Alloy thin films were prepared and electroless plating was carried out in the same way as in Example 1, except that the alloy thin film compositions as given in Table 1 was used. The same evaluation as in example 1 was conducted thereafter.

The results are given in Table 1.

TABLE 1

| | Alloy thin film metal B (at %) metal A (at %) | Oxygen content (at %) at interface between alloy thin film and metal thin film | Copper diffusion | Holes after stripping of copper plating thin film | Resistivity of copper plating thin film ($\mu\Omega \cdot cm$) | Thickness of copper plating thin film (nm) | Filling ability of trench portions having 90 nm line width |
|---|---|---|---|---|---|---|---|
| Example 1 | W(60) Ru(40) | <1 | No | No | 3.5 | 7 | o |
| Example 2 | W(80) Ru(20) | <1 | No | No | 3.2 | 8 | o |
| Example 3 | W(90) Ru(10) | <1 | No | No | 3.6 | 8 | o |
| Example 4 | W(70) Rh(30) | <1 | No | No | 3.8 | 7 | o |
| Example 5 | W(70) Ir(30) | <1 | No | No | 3.4 | 9 | o |
| Example 6 | Nb(80) Ru(20) | <1 | No | No | 8.0 | 5 | o |
| Comparative example 1 | Ta(70) Ru(30) | 8 | No | No | 5.0 | 15 | x |
| Comparative example 2 | W(98) Ru(2) | | | No film formation | | | |
| Comparative example 3 | W(40) Rh(60) | <1 | Yes | No | 3.3 | 8 | o |
| Comparative example 4 | Ta(80) Ir(20) | 15 | No | No | 12.5 | 5 | x |

Occurrence of copper diffusion: determined based on AES depth profile measurements
Presence of holes after stripping of copper plating thin film: the copper plating thin film was dipped in 50% nitric acid for 15 seconds at room temperature, followed by surface observation by FE-SEM, to determine presence of craters measuring 10 nm or more.
Resistivity of copper plating thin film: calculated on the basis of sheet resistance measurements by the four-probe method, and thickness measurements by cross-sectional TEM observation
Thickness of the copper plating thin film: determined by cross-sectional TEM observation
Filling ability of trench portions having 90 nm line width: presence or absence of voids and seams based on cross-sectional TEM observation, o: no voids/seams, x voids/seams

What is claimed is:

1. A plated article which has an alloy thin film formed on a substrate and containing a catalytically active metal (A) for electroless plating and a metal (B) capable of undergoing displacement plating with a metal ion contained in an electroless plating solution, the alloy thin film is a single layer having both a barrier function and catalytic ability, and a metal thin film formed on the alloy thin film by electroless displacement and reduction plating, wherein the alloy thin film containing the catalytically active metal (A) and the metal (B) capable of displacement plating has a composition comprising 5at% to 40at% of the catalytically active metal (A), the thickness of the alloy thin film ranges from 3 to 20 nm, the catalytically active metal (A) is at least one metal selected from among rhodium, ruthenium and iridium, and the metal (B) capable of displacement plating is at least one metal selected from among iron, nickel, cobalt, tungsten, niobium, tin, magnesium, aluminum, zinc and lead, and the metal thin film formed by electroless displacement and reduction plating is a metal thin film having a thickness no greater than 10 nm and a resistivity no greater than 10 $\mu\Omega \cdot cm$.

2. The plated article according to claim 1, wherein the metal thin film formed by electroless displacement and reduction plating has a resistivity no greater than 5 $\mu\Omega \cdot cm$.

3. The plated article according to claim 1, wherein a wiring portion is further formed on the metal thin film by plating.

4. The plated article according to claim 3, wherein
the metal thin film formed on the alloy thin film by electroless displacement and reduction plating is a thin film comprising at least one metal selected from among gold, silver, copper, nickel, cobalt, iron and tin, and
the wiring portion is copper or an alloy having copper as a main component.

5. The plated article according to claim 4, wherein the metal (B) capable of displacement plating has a barrier function of preventing diffusion of a metal of the metal thin film formed by electroless displacement and reduction plating.

6. The plated article according to claim 4,
wherein the catalytically active metal (A) is at least one metal selected from among rhodium and ruthenium,
the metal (B) capable of displacement plating is at least one metal selected from among tungsten and niobium,
the metal thin film formed on the alloy thin film by electroless displacement and reduction plating is a thin film of copper or of an alloy having copper as a main component, and
the wiring portion is copper or an alloy having copper as a main component.

7. The plated article according to claim 4,
wherein the catalytically active metal (A) is ruthenium,
the metal (B) capable of displacement plating is tungsten,
the metal thin film formed on the alloy thin film by electroless displacement and reduction plating is a copper thin film, and
the wiring portion is copper.

8. The plated article according to claim 1, wherein the oxygen concentration at the interface between the alloy thin film and the metal thin film formed by electroless displacement and reduction plating is no greater than 1at% as analyzed by Auger electron spectroscopy.

9. The plated article according to claim 1, wherein the metal thin film formed by electroless displacement and reduction plating is a seed layer for damascene copper wiring.

10. The plated article according to claim 1, wherein the alloy thin film is formed by sputtering.

11. A sputtering target used for forming the alloy thin film of the plated article according to claim 10.

12. A semiconductor element, comprising the plated article according to claim 1.

13. A method for manufacturing a plated article comprising the steps of forming, on a substrate, an alloy thin film containing a catalytically active metal (A) for electroless plating and a metal (B) capable of undergoing displacement plating with a metal ion contained in an electroless plating solution, the alloy thin film is a single layer having both a barrier function and catalytic ability, and forming a metal thin film on the alloy thin film by electroless displacement and reduction plating, wherein the alloy thin film containing the catalytically active metal (A) and the metal (B) capable of displacement plating has a composition comprising 5at% to 40at% of the catalytically active metal (A), the thickness of the alloy thin film ranges from 3 to 20 nm, the catalytically active metal (A) is at least one metal selected from among rhodium, ruthenium and iridium, and the metal (B) capable of displacement plating is at least one metal selected from among iron, nickel, cobalt, tungsten, niobium, tin, magnesium, aluminum, zinc and lead, and the metal thin film formed by electroless displacement and reduction plating is a metal thin film having a thickness no greater than 10 nm and a resistivity no greater than 10 $\mu\Omega\cdot cm$.

14. The method for manufacturing a plated article according to claim 13, wherein the metal thin film formed by electroless displacement and reduction plating has a resistivity no greater than 5 $\mu\Omega\cdot cm$.

15. The method for manufacturing a plated article according to claim 13, wherein a wiring portion is further formed on the metal thin film by plating.

16. The method for manufacturing a plated article according to claim 15,
wherein
the metal thin film formed on the alloy thin film by electroless displacement and reduction plating is a thin film comprising at least one metal selected from among gold, silver, copper, nickel, cobalt, iron and tin, and
the wiring portion is copper or an alloy having copper as a main component.

17. The method for manufacturing a plated article according to claim 16, wherein the metal (B) capable of displacement plating has a barrier function of preventing diffusion of a metal of the metal thin film formed by electroless displacement and reduction plating.

18. The method for manufacturing a plated article according to claim 16,
wherein the catalytically active metal (A) is at least one metal selected from among rhodium and ruthenium,
the metal (B) capable of displacement plating is at least one metal selected from among tungsten and niobium, the metal thin film formed on the alloy thin film by electroless displacement and reduction plating is a thin film of copper or of an alloy having copper as a main component, and
the wiring portion is copper or an alloy having copper as a main component.

19. The method for manufacturing a plated article according to claim 16,
wherein the catalytically active metal (A) is ruthenium,
the metal (B) capable of displacement plating is tungsten,
the metal thin film formed on the alloy thin film by electroless displacement and reduction plating is a copper thin film, and
the wiring portion is copper.

20. The method for manufacturing a plated article according to claim 13, wherein the oxygen concentration at the interface between the alloy thin film and the metal thin film formed by electroless displacement and reduction plating is no greater than 1 at% as analyzed by Auger electron spectroscopy.

21. The method for manufacturing a plated article according to claim 13, wherein the metal thin film formed by electroless displacement and reduction plating is a seed layer for damascene copper wiring.

22. The method for manufacturing a plated article according to claim 13, wherein the alloy thin film is formed by sputtering.

* * * * *